United States Patent [19]

Oliveri et al.

[11] Patent Number: 5,032,887
[45] Date of Patent: Jul. 16, 1991

[54] BIPOLAR POWER SEMICONDUCTOR DEVICE AND PROCESS FOR ITS MANUFACTURE

[75] Inventors: Carmelo Oliveri, Castiglione di Silicia; Alfonso Patti; Sergio Fleres, both of Catania, all of Italy

[73] Assignee: SGS-Thomson Microelectronics s.r.l., Italy

[21] Appl. No.: 344,568

[22] Filed: Apr. 28, 1989

[30] Foreign Application Priority Data

May 5, 1988 [IT] Italy ................................ 6611 A/88

[51] Int. Cl.⁵ .................... H01L 29/72; H01L 23/48; H01L 29/44; H01L 29/52
[52] U.S. Cl. .......................... 357/36; 357/71; 357/68; 357/34
[58] Field of Search .............. 357/71, 36, 34, 68, 357/51, 33, 65

[56] References Cited

U.S. PATENT DOCUMENTS

| | | | |
|---|---|---|---|
| 3,381,183 | 4/1968 | Turner et al. | 357/36 |
| 3,843,425 | 10/1974 | Katnack | 357/36 |
| 4,008,484 | 2/1977 | Maekawa et al. | 357/36 |
| 4,151,542 | 4/1979 | Yajima et al. | 357/36 |
| 4,291,319 | 9/1981 | Carinalli | 357/13 |
| 4,417,265 | 11/1983 | Murkland | 357/68 |
| 4,581,626 | 4/1986 | Krishna | 357/38 |
| 4,618,877 | 10/1986 | Araki et al. | 357/56 |
| 4,618,878 | 10/1986 | Aoyama et al. | 357/71 |
| 4,656,496 | 4/1987 | Widlar | 357/36 |

OTHER PUBLICATIONS

IBM Technical Disclosure Bulletin, vol. 20, No. 1, Jun. 1977, "Power Transistors", S. P. Gaun, p. 286.
VLSI Technology, McGraw-Hill Book Company, pp. 123-125, 1986.
Miller et al., An Advanced High Voltage Bipolar Transistor with Extended RBSOA Using 5 μm Small Emitter Structures, IEDM 85, pp. 142-145, 1985, IEEE.

Primary Examiner—Jerome Jackson, Jr.
Assistant Examiner—Donald L. Monin, Jr.
Attorney, Agent, or Firm—Pollock, Vande Sande & Priddy

[57] ABSTRACT

A bipolar power semiconductor device, particularly a transistor, of structure formed by a matrix array of cells operating as emitter regions, comprises two separated and superposed layers of metal, one for the base and one for the emitter, separated by a layer of polyimide, as an intermediate dielectrtic.

7 Claims, 3 Drawing Sheets

BIPOLAR POWER SEMICONDUCTOR DEVICE AND PROCESS FOR ITS MANUFACTURE

BACKGROUND OF THE INVENTION

1. Field of the Invention

The present invention relates to bipolar semiconductor devices, and in particular to said devices designed for power utilization.

More particularly, the present invention regards the manufacture of a semiconductor device having a matrix array of cells operating as emitter regions. With this structure a high number of small components are constructed, for example elementary transistors, which are parallel operating, and whose electric functions contribute proportionally to form the current and voltage characteristics of the resulting device.

As the single cells are of regular disposition and size, a perfect balancing of the structure is obtained, from which a certain number of very important advantages derive.

The current loads are equally divided in an homogenous manner in comparison to the usual structures of planar transistors having interdigitated base and emitter. Consequently, the device is stronger and has a higher switching speed.

2. Description of the Prior Art

A semiconductor device produced with a matrix array of cells working as emitters is described for example in the European Patent Application 186140.

In this publication a power switch is shown, which can be transistor or a GTO thyristor, in which a plurality of emitter regions are distributed on the base according to a matrix configuration and parallel connected by means of conductors formed of a layer of metal.

The production of a similar cellular structure, although simple in concept, is in fact limited by technological difficulties, essentially connected to the quality and quantity of the conducting and insulating materials to be deposited.

A particular difficulty in the manufacture, which causes an important limitation in terms of performance and robustness, is the necessity of realizing the configuration with a suitable separation of the base and emitter metallization.

In order to solve this problem, according to the present invention, the two metallizations are superposed vertically, and between the two layers of metal an intermediate dielectric layer is interposed. It is thus possible to realize a structure in which the emitter is formed by a set of single cells, spread out on the base area.

A device denominated SIRET (Siemens Ring Emitter Transistor) is described in a communication published on the occasion of its presentation at IEDM 85.

This device, which consists in a high voltage bipolar power switch transistor, shows a structure with a first metallization configuration in contact with the base, in the form of a mesh around emitter cells. Above said metallization is an insulating layer of silicon nitride, above which there is a second layer of emitter metal. The emitters are placed according to a matrix configuration, forming cells.

In this structure the cells are open and empty, there being no physical contact between the two layers of metal in corrispondence with said cells. The realization of this structure presents particular construction problems for the complexity of the working phases, due to the materials employed.

SUMMARY OF THE INVENTION

With the method of manufacture of the present invention, the cellular structure is easily constructed without limitations as far as the depth of the base metal layer is concerned, and with the total absence of short-circuits between base and emitter.

The device according to the present invention comprises essentially: a collector and a base formed from overlaid layers of materials of a first and a second type of conductivity; a series of separate cellular regions of the first type of conductivity, placed in a matrix array on said base, said cellular regions and said base being of materials of opposite conductivity, so as to form a plurality of base-emitter junctions by means of a matrix array of cells which form emitter regions, in a continuous base region around said cells; a series of annular oxide regions separate one from the other and placed around said cellular regions, above the base-emitter junction contact; and bond pad areas for base and emitter respectively, the device being characterized by the fact that it comprises: a first metal layer applied on the continuous base region and on said emitter regions, with the exclusion of the emitter bond pad area and the upper surface of said oxide annular regions, so that the metal on the base region and the metal on the emitter regions are electrically disconnected; a first dielectric layer formed by polyimide superposed on the metal of the base region, with the exclusion of the base bond pad area, and furthermore superposed on said oxide regions; a second metal layer superposed on said first metal layer in correspondence with said emitter regions, on said dielectric layer, and on said base and emitter bond pad areas, with exclusion of electric contact continuity between said bond pad areas of base and emitter, through said second metal layer, so that the first and the second layer of metallization are in electric contact on two superposed planes in the emitter regions; and a second dielectric layer formed of polyimide superposed as a passive layer on said second metal layer, with the exclusion of the base and emitter bond pad areas.

A further object of the present invention is a process for the manufacture of a bipolar power semiconductor device of the type illustrated hereinbefore, comprising the conventional initial operations of formation of the base, oxidation, opening windows in the base oxide, and diffusion of dopant for the formation of the emitter regions with protection of the oxide at the base-emitter junction, in which process, according to the invention, the following operations are carried out in a successive sequence: depositing a first layer of metallization and removing the metal of said first metal layer from the oxide surfaces of the emitter regions and from the oxide of the emitter bond pad area by means of a photolithographic method; depositing a first dielectric layer formed by polyimide for insulation, and removing said dielectric from the emitter regions and from the emitter and base bond pad areas by means of a photolithographic method; depositing a second layer of metallization and removing the metal of said second metal layer from a continuous strip surrounding the base bond pad area by means of a photolithographic method; and depositing a second dielectric layer formed of polyimide as a passive layer and removing the dielectric of said second layer from the base and emitter bond pad areas.

The present invention will be illustrated in a preferred embodiment in which the semiconductor device is an NPN transistor. However, the invention can also be applied in the same way to a PNP transistor.

The invention can also be applied to integrated structures which are more complex than a single transistor, as for example Darlington transistors with two or more steps, as well as structures with whatever type of termination of the base-collector (planar transistors, mesa, etc.).

Furthermore, the invention described with reference to transistors in general can be applied to thyristors, GTO solid state switches and other applications.

DESCRIPTION OF THE PREFERRED EMBODIMENT

Figure 1:
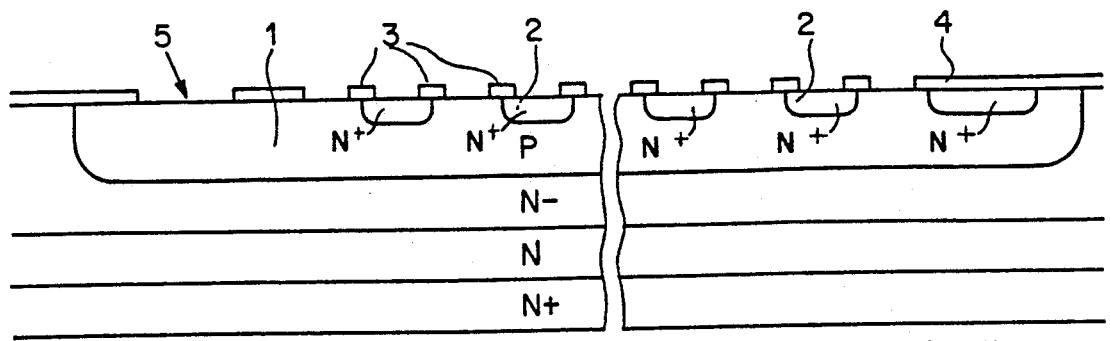
FIG. 1 shows schematically an incomplete NPN transistor structure, which forms the starting point from which the present invention deviates from the prior art.

With reference to FIG. 1, the transistor structure comprises a multilayer epitaxial wafer with an N type substrate of low resistivity (N+), an N type layer, an N type layer of high resistivity (N−). By means of the usual operations used in planar manufacture technology, the structure of the transistor immediately preceding the application of the metallization was obtained, as shown in FIG. 1. In the base region 1, after oxidation, windows were opened with a suitable masking, and the deposition and diffusion of the emitter dopant followed to create emitter regions indicated with 2. Said regions are disposed on the plate according to a matrix array.

After successive operations, using a special photolithographic technique, the silicon contacts were opened into the oxide in the emitter regions, thus creating single cells forming emitter regions 2. The silicon is also caused to emerge on the base region surrounding the cells or emitter regions 2, so that an oxide annulus remains around each cell 2. This is obtained by masking with resist said oxide annulus in order that it is preserved and insulates the base-emitter junction on its surface.

In this phase the oxide area 4 reserved for the emitter bond pad is also masked, in order that it remains insulated from the underlying N+ doped region. The area 5 for the base bond pad is on the contrary uncovered to have the successive contact with the base metallization. The operations described above bring about a structure as shown in FIG. 1.

In said structure the base region 1 can have a depth of $10\mu$, whereas the emitter cells 2 have a diameter of $80\mu$ and a depth of $5\mu$, said values being purely indicative.

According to the present invention the metallization of the transistor is realized as two vertically offset metal layers, with the interposition between the metals of an insulating layer of polyimide.

A suitable metal for metallization is an aluminium-silicon alloy which can be applied, for example, by means of sputtering.

Figure 3:
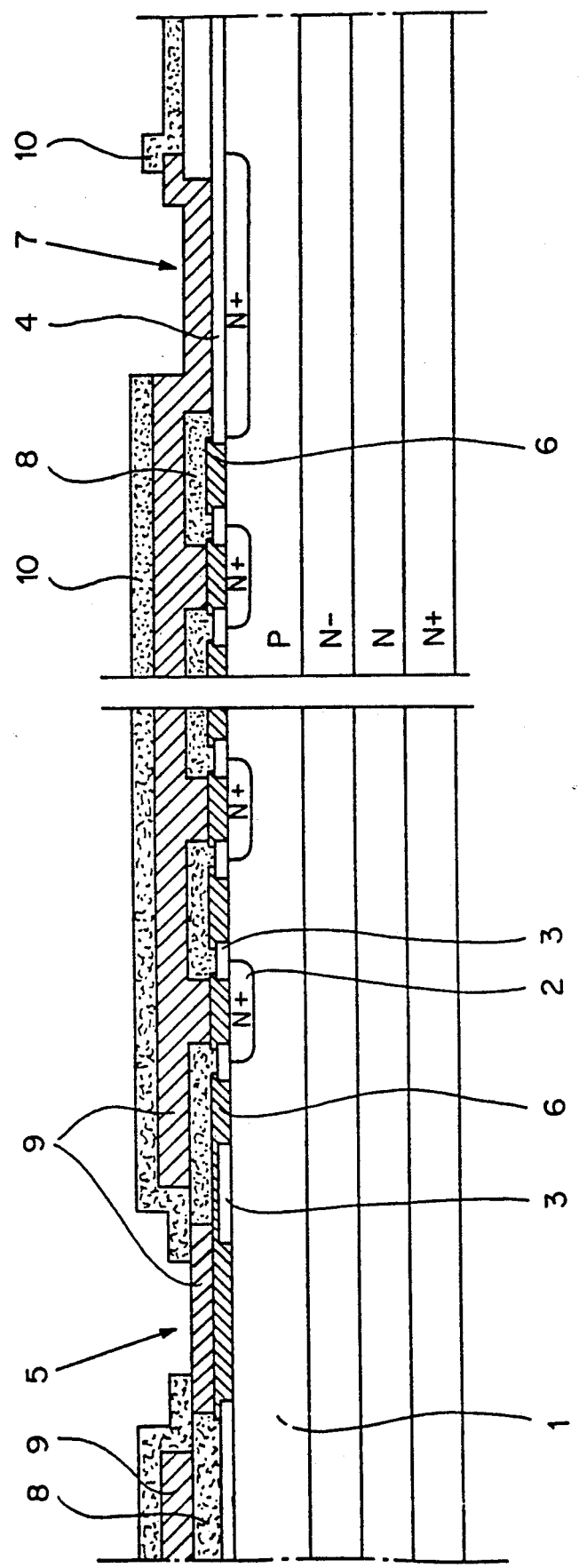
FIG. 3 is a section along to line III—III on FIG. 4 of the device according to the invention.

The first layer of metallization is thus applied onto a structure such as that shown in FIG. 1 and successively, by means of photolithographic removal, the metal of this layer, indicated with the number 6 in FIG. 3, is left on the base bond pad area 5 and on the emitter cells 2, being on the contrary removed from the emitter bond pad area 7.

On the first metal layer 6 a layer of insulating dielectric, indicated with 8, is applied.

It has been found that polyimide is an ideal dielectric, as it allows the employment of usual techniques and apparatuses, of relatively low cost and high efficiency. In particular, polyimide can be applied by means of a spin coating process, that is to say using the same method with which photoresists are usually deposited. This allows a surface topography to be obtained, which is as far as possible planar, before the deposition of the second metal layer.

Other insulators of inorganic type, currently in use in microelectronics, for example silicon nitride, applied by means of chemical vapor deposition, in fact, give problems of particular difficulty. Said problems can be resumed as high mechanical defectiveness of the film, low growth rate with respect to the thickness required, prohibitive stress introduced onto the substrate, which grow in proportion to the thickness and which give the wafer a resulting fragility, and finally a poor covering of the steps generated by the preceding phototechniques, in proportion to their height.

The layer of polyimide indicated with 8 in FIG. 3 is then treated by means of a photolithographic process to remove the polymide from the base and emitter bond pad areas, indicated respectively with 5 and 7, and from the emitter cells 2.

The polyimide layer 8 thus remains above the first metal layer, in the base region disposed around the emitter cells 2 and having a mesh configuration.

A second layer of metallization indicated with 9 is applied, also preferably by means of sputtering, onto the first metal layer 6 and the polyimide layer 8, where this remains. The second metal layer 9 therefore serves to connect the emitter regions 2 with the emitter bond pad areas 7, as well as to form a thicker metal layer on the base bond pad area 5.

It is obvious that the base bond pad area 5 and the emitter bond pad area 7 must be ohmically insulated, so that the second metal layer 9 will be removed by means of a photolithographic technique along a strip all around the base bond pad area 5.

The metal used for the second metallization can be a different metal from that used for the first metallization, or else the same metal as that used for the first, in particular silicon-aluminium alloy.

Figure 2A:
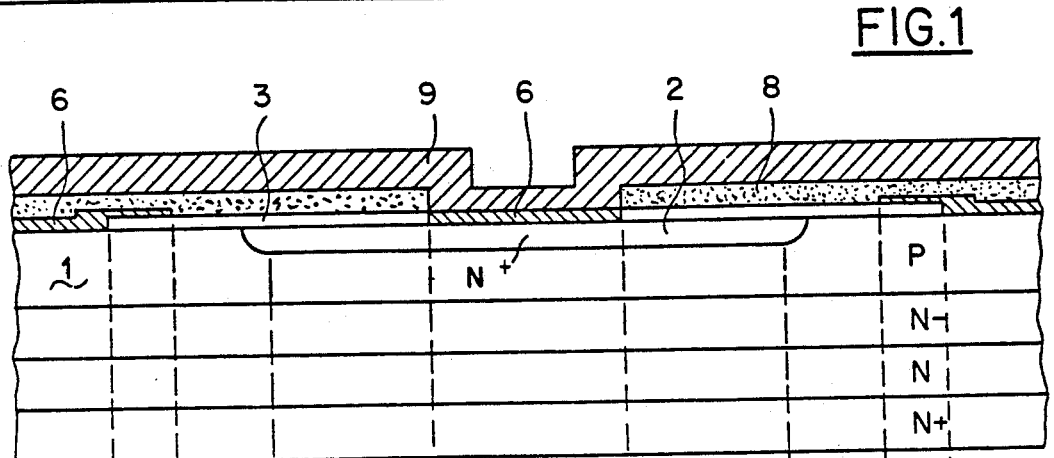
FIGS. 2(a) and 2(b) are respectively a section and a plan view from above of the structure of an emitter region of the device according to the invention.
Figure 2B:
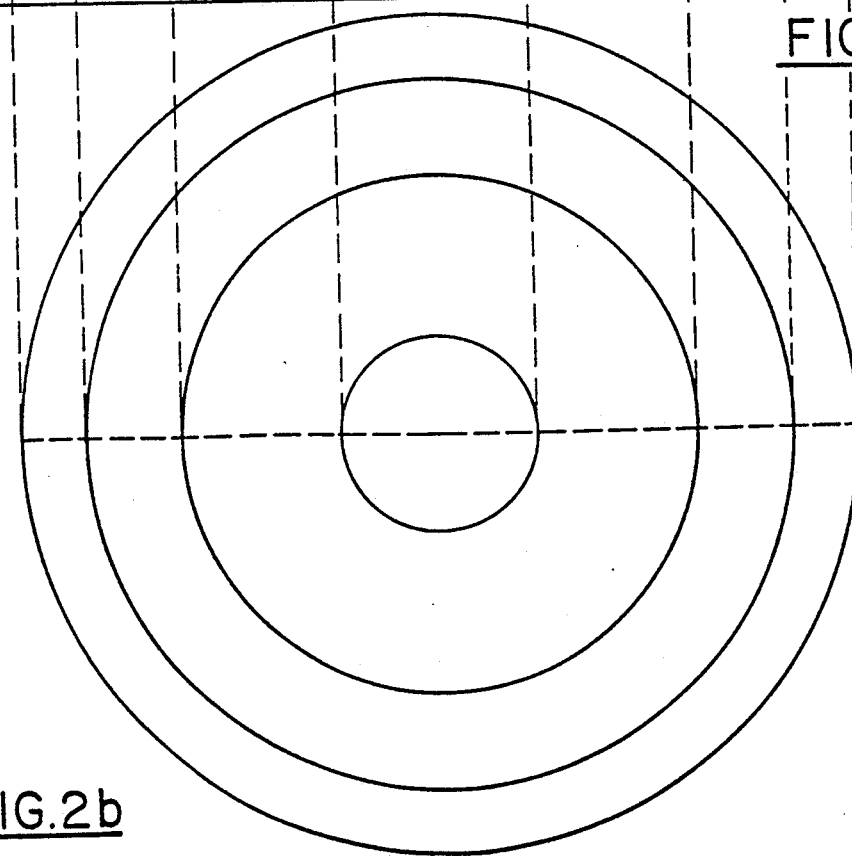

The cellular structure of the emitter region thus obtained is better illustrated in FIGS. 2(a) and 2(b), which are respectively a transversal section and a plan view of each cell in a close-up view.

As an example of a structure which can be realized by means of the present invention, the cell or emitter 2 can have a diameter of $30\mu$ on an emitter doped region having a diameter of $80\mu$. The oxide ring 3 around the emitter shows typically an internal diameter of $30\mu$ and an external diameter of $130\mu$, with a superposition of the first metal layer 6 on the oxide of about $20\mu$ in a radial direction.

Again as a non-limitative example, the first metallization can have a thickness of around 3μ and the second metallization can have a thickness of 6μ, while the interposed polyimide layer can have a thickness of from about 3 to 3,6μ.

The process by which the silicon/metal contacts are obtained in the process according to the invention is of fundamental importance for the efficiency of the device. As there are two distinct layers of metallization for base and emitter, the respective contacts must be formed in two separate moments. It must be noted that in order to obtain contacts with low resistivity it is necessary that the surface of the silicon should not have been damaged and that it be free from deposits and native oxide.

The first metallization layer covers, along with the base areas around the cells 2, also the open contacts within the cells themselves. This enables the silicon to be physically sealed and protected from contaminations and damage during the successive phases of formation of the emitter contact. In fact, according to the invention, the contacts are opened in a single phase both for the base and for the emitter. This sequence allows optimization of the metal/silicon contact resistence within the emitter cell and furthermore the surface offered for deposition of the second metallization layer is much flatter. In this way an eventual thinning of the metal in correspondence with the edges of the emitter cell is avoided.

The thermal treatment after patterning of the first metal layer performs both the base and the emitter ohmic contact between silicon and metal. The emitter electric contact is then realized in the form of a metal/-metal contact.

A transistor obtained in the above described manner shows notable characteristics from the point of view of robustness and switching speed.

The matrix cell configuration, which allows optimal balancing of the structure, eliminates the presence of focusing points of the emitter current and of consequent failures due to Is/b (direct secund breakdown) or Es/b (inverse secund breakdown).

The performance in switching also results better with respect to interdigited planar transistors of equal area, thanks to the speed with which an elementary cell switches off and to the speed with which the extraction current can be collected along the "mesh" configured base region.

With the cellular solution it is possible to effect current sensing by measuring the current on an elementary device only, which will be a known fraction of that of the whole device.

Consequently, in general, it is possible to push beyond the actual limits the performance of a device, constructed with consolidated technology, which is relatively non-complex and economical, such as the planar one. In fact, the additional operations necessary to obtain the structure described contribute only in a negligable part, with respect to the final advantages, to the complication of the process and the increase in costs.

The performance of the device obtained according to the invention will be better appreciated when compared, in fact, with the simplicity of the constructive method. The total number of operations remains in fact limited and the only additional steps are the deposition and photolithography of the polyimide and of the second metal layer.

As stated hereinbefore, these operations do not require the use of equipment and techniques different from those commonly available. No additional investments are needed for example for the use of polyimide, which can be deposited by spin coating.

Though other dielectrics of inorganic type could be used, however, these require sophisticated apparatus and large investments, accessory services and the use of dangerous gasses.

Figure 4:
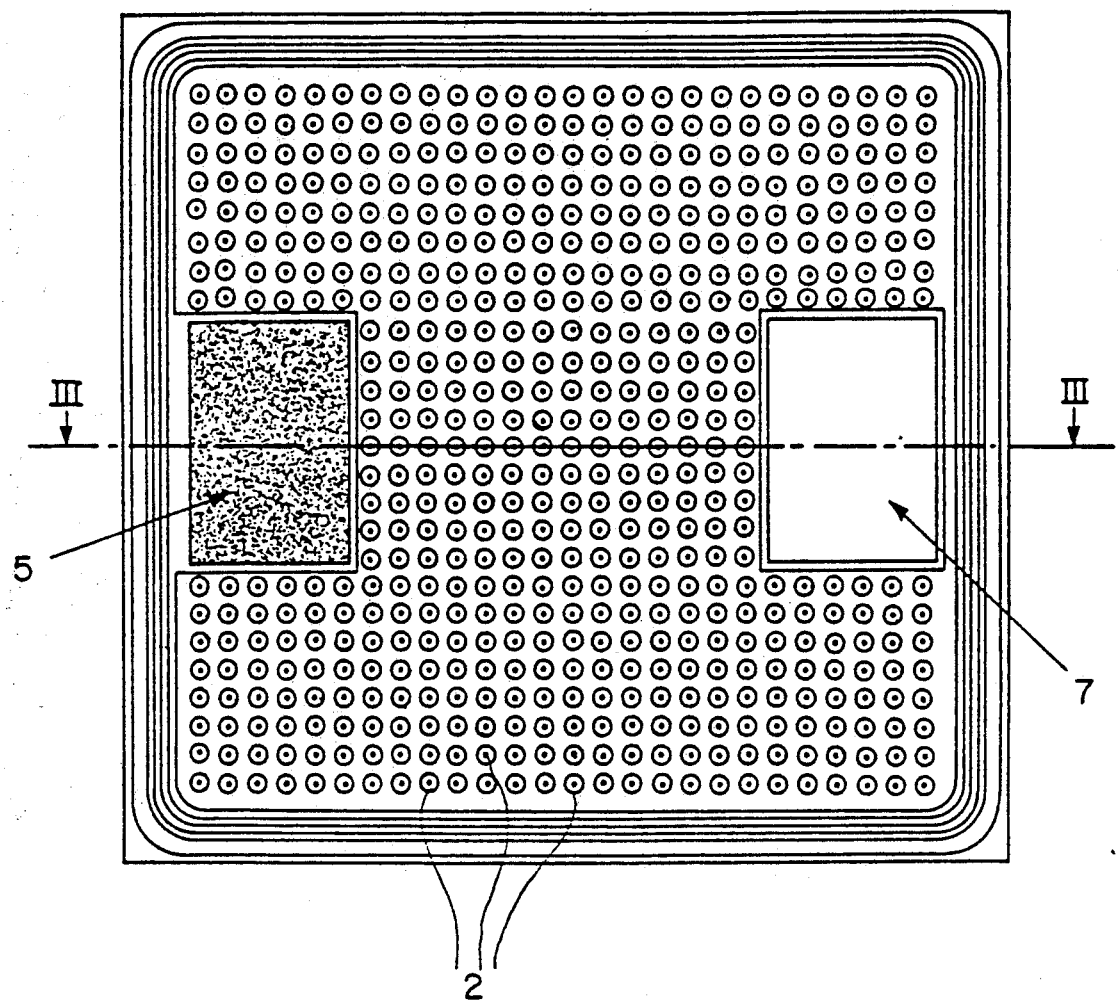
FIG. 4 is a view from above of the structure with cells in a matrix configuration of the device according to the invention.

In FIG. 4 a wafer is illustrated with the matrix configuration of emitter cells. The base bond pad 5 and the emitter bond pad 7 are also clearly seen.

Electric measurements of static and dynamic type have been carried out on a transistor according to the preceding description.

The breakdown measurements with open base and with emitter and base in shortcircuit show results similar to those of other conventional bipolar transistors.

The electric measurements of dynamic type show that the cellular structure according to the present invention is by far more rapid, for example than a hollow emitter structure, reaching fall speeds in the order of several tens of nanoseconds.

These results are obtained thanks to the ease with which the elementary cells switch off, both in voltage and current extraction.

The storage also shows itself to be more rapid than in a hollow emitter device in the same conditions.

Although the presence of the two layers of metallization induces a capacity between base and emitter, this has no negative effect on the switching on speed.

In fact, the measurement of ton carried out on a resistive load has shown that the switching on speed of a device according to the invention is in all ways comparable to that of a hollow emitter device in the same conditions, and that, what is more, the t rise is much more rapid.

The multicellular structure produced according to the invention has optimum behaviour also in RBSOA, being capable of switching 7 ampere beyond the breakdown voltage with open base, both in voltage and current extraction.

From the above description it will thus be seen that the object of the invention has been attained of producing a semiconductor device manufactured with low-cost techniques, also having a performance comparable to that of conventional semiconductor devices manufactured according to more sophisticated techniques.

We claim:

1. Bipolar semiconductor device consisting essentially of: a collector and a base formed from overlaid layers of materials of a first and a second type of conductivity; a series of separate cellular regions of the first type of conductivity, placed in a matrix array on said base, said cellular regions and said base being of materials of opposite conductivity, so as to form a plurality of base-emitter junctions by means of a matrix array of cells which form emitter regions, in a continuous base region around said cells; a series of annular oxide regions separate one from the other and placed around cellular regions, above the base-emitter junction contact; bond pad areas for base and emitter respectively, and a first metal layer applied on the continuous base region and on said emitter regions, with the exclusion of the upper surface of said oxide annular regions, said device comprising: said first metal layer being applied on said emitter regions with the exclusion of the emitter bond pad area; polyimide dielectric layer superposed on the metal of the base regions, with the exclusion of the base bond pad area, and also superposed on said oxide regions; a second metal layer superposed respectively on said first metal layer in correspondence with said emitter regions, on said dielectric layer, and on said base and emitter bond pad areas, with exclusion of electric contact continuity between said bond pad areas of base and emitter, through said second metal layer, so that the first and the second layer of metallization are in electric contact on two superposed planes in the emitter regions; and a second polyimide dielectric layer superposed as a passive layer on said second metal layer, with the exclusion of the base and emitter bond pad areas.

2. Device according to claim 1, in which said first and second metal layers are formed by the same metal.

3. Device according to claim 1, forming part of an integrated circuit.

4. Device according to claim 2 wherein said first and second metal layers are formed from aluminum.

5. Device according to claim 4 wherein said base and emitter regions are doped silicon.

6. The device according to claim 1 wherein said second metal layer is continuous with said first metal layer in correspondence with said emitter regions.

7. The device according to claim 6 wherein said second metal layer is homogeneous.

* * * * *